(12) United States Patent
Cai

(10) Patent No.: US 8,269,279 B2
(45) Date of Patent: Sep. 18, 2012

(54) HIGH SPEED, LOW POWER CONSUMPTION, ISOLATED ANALOG CMOS UNIT

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 175 days.

(21) Appl. No.: 12/862,163

(22) Filed: Aug. 24, 2010

(65) Prior Publication Data

US 2010/0315155 A1  Dec. 16, 2010

Related U.S. Application Data

(62) Division of application No. 12/365,228, filed on Feb. 4, 2009, now Pat. No. 7,800,179.

(51) Int. Cl.
*H01L 27/01* (2006.01)
*H01L 27/12* (2006.01)
*H01L 31/0392* (2006.01)

(52) U.S. Cl. .......... 257/351; 257/369; 327/537

(58) Field of Classification Search .......... 257/351
See application file for complete search history.

(56) References Cited

U.S. PATENT DOCUMENTS

| | | |
|---|---|---|
| 5,394,026 A | 2/1995 | Yu et al. |
| 5,795,803 A | 8/1998 | Takamura et al. |
| 2005/0164439 A1 | 7/2005 | Takamura |
| 2007/0018248 A1* | 1/2007 | Chuang et al. ............ 257/351 |
| 2007/0205470 A1 | 9/2007 | Kang et al. |

FOREIGN PATENT DOCUMENTS

KR       100702364 B1    4/2007

OTHER PUBLICATIONS

International Search Report and Written Opinion of the ISA (KIPO) dated Sep. 27, 2010, from corresponding PCT Appl. No. PCT/US2010/022812; international filing date: Feb. 2, 2010 (total 6 pgs.).

* cited by examiner

*Primary Examiner* — Thien F Tran
(74) *Attorney, Agent, or Firm* — Hiscock & Barclay, LLP

(57) ABSTRACT

A semiconductor device including: a low threshold PMOS device formed over an N-type region, the source and drain of the low threshold PMOS formed in P-regions surrounded by N-regions; a low threshold NMOS device formed in a P-type region, the source and drain of the low threshold NMOS formed in N-regions surrounded by P-regions; first and second substrate bias generators, each connected to one of the low threshold devices for generating a substrate bias; a voltage source for generating substrate bias during a standby mode to reduce leakage current; wherein a low voltage threshold is established by the source and drain regions of the low threshold devices and their respective surrounding regions of opposite polarity.

12 Claims, 8 Drawing Sheets

HIGH SPEED, LOW POWER CONSUMPTION, ISOLATED ANALOG CMOS UNIT

CROSS REFERENCE TO RELATED APPLICATIONS

This application is a divisional of U.S. patent application Ser. No. 12/365,228, filed on Feb. 4, 2009, published as U.S. Publication No. 20100193878, which is hereby incorporated herein by reference in its entirety.

BACKGROUND

MOSFET technology could be used to make high speed, low power consumption circuits for mobile, computing, communication and consumer products. However, the requirements for handling high speed and low power consumption often require fundamental tradeoffs. In mobile applications, such as cell phones, high speed and low power consumption are key criteria. Often optimizing one criterion will negatively impact the other. Low threshold voltage, a voltage between the source and the gate of a MOSFET when it appears current first begins to flow in the transistor, is always preferred for high speed MOSFET. A relatively high threshold voltage reduces MOSFET off-state leakage and that is good because it lowers power consumption. However, high threshold voltage devices switch slower than low threshold devices. Setting high thresholds saves power but reduces speed. If speed of operation is important, then designers want devices with low threshold voltages. Designers are familiar with the tradeoff between speed and power. It would benefit the design of mobile products to have both high speed and low power consumption.

SUMMARY

Exemplary embodiments of the invention provide a low threshold voltage CMOS pair that is isolated from the substrate, operates at high speed, and has low on resistance. The exemplary embodiments also provide circuits with a pair of high threshold voltage CMOS transistors and low threshold voltage CMOS transistors. The high threshold voltage CMOS transistors operate in a stand-by mode to keep circuit leakage low. In one embodiment the high threshold voltage MOSFETs are in series with low threshold MOSFETs of the same, respective polarities. In another embodiment the high threshold voltage MOSFETs are configured as an analog gate which is disposed between a power source and ground. In both of those embodiments the gates of the high threshold MOSFETs are controlled by a common control signal. The control signal is connected to one of the gates of the high threshold MOSFET and an inverse of the control signal is connected to the gate of the other high threshold MOSFET.

One exemplary embodiment is an integrated circuit comprising four transistors. This circuit may be a building block for other, more complex circuits and may be repeated a number of times in an integrated circuit. It is also possible to embody the exemplary circuit as a cell in a library of design cells for integrated circuits. The circuit is built on a P substrate (either P+or P−) and has high and low threshold PMOS devices formed over an N-type region. The PMOS devices are formed in an N-type well over the P substrate. The high threshold PMOS device has a P+ source disposed in an N-body. The drain of the high threshold PMOS and the source and drain of the low threshold PMOS are formed in P/N-buffer regions that are also in the N-well.

High and low threshold NMOS devices formed in P-type regions. The high threshold NMOS device has an N+ source disposed in a P-body and the drain of the high threshold NMOS and the source and drain of the low threshold NMOS formed in N/P-buffer regions surrounded by P-regions.

The PMOS and NMOS devices are junction isolated from the substrate and are laterally dielectrically isolated from each other. The low voltage thresholds are established by the source and drain regions of the low threshold transistors and their respective surrounding regions of opposite polarity.

In one exemplary circuit the high and low threshold devices of the same polarity are in series with each other and the drain of one high threshold device is connected to the source of the other low threshold device. The circuit has a control terminal that directly connects a control signal to the gate of one of the high threshold devices and connects an inverted control signal to the other high threshold device. An inverter disposed between the control terminal and the other high threshold voltage device, inverts the control signal applied to the control terminal.

In another exemplary circuit the high threshold devices of are connected in parallel with each other and they are disposed between a source of current or voltage and the two low threshold voltage transistors. The drain of one low threshold device (p-channel) is connected to the drain of the other low threshold device (n-channel). A control terminal directly connects a control signal to the gate of one of the high threshold devices and connects an inverted control signal to the other high threshold device. An inverter disposed between the control terminal and the other high threshold voltage device inverts the control signal applied to the control terminal.

The exemplary and other embodiments are made with an efficient process. The process uses two dual implants with opposite polarity (heavily doped source & body) for each source of the high threshold devices, and two other dual buffer implants for the source/drains of the low threshold voltage devices and drains of the high threshold voltage devices, respectively. The process steps are very simple with low cost.

DRAWINGS

DETAILED DESCRIPTION

Figure 1:
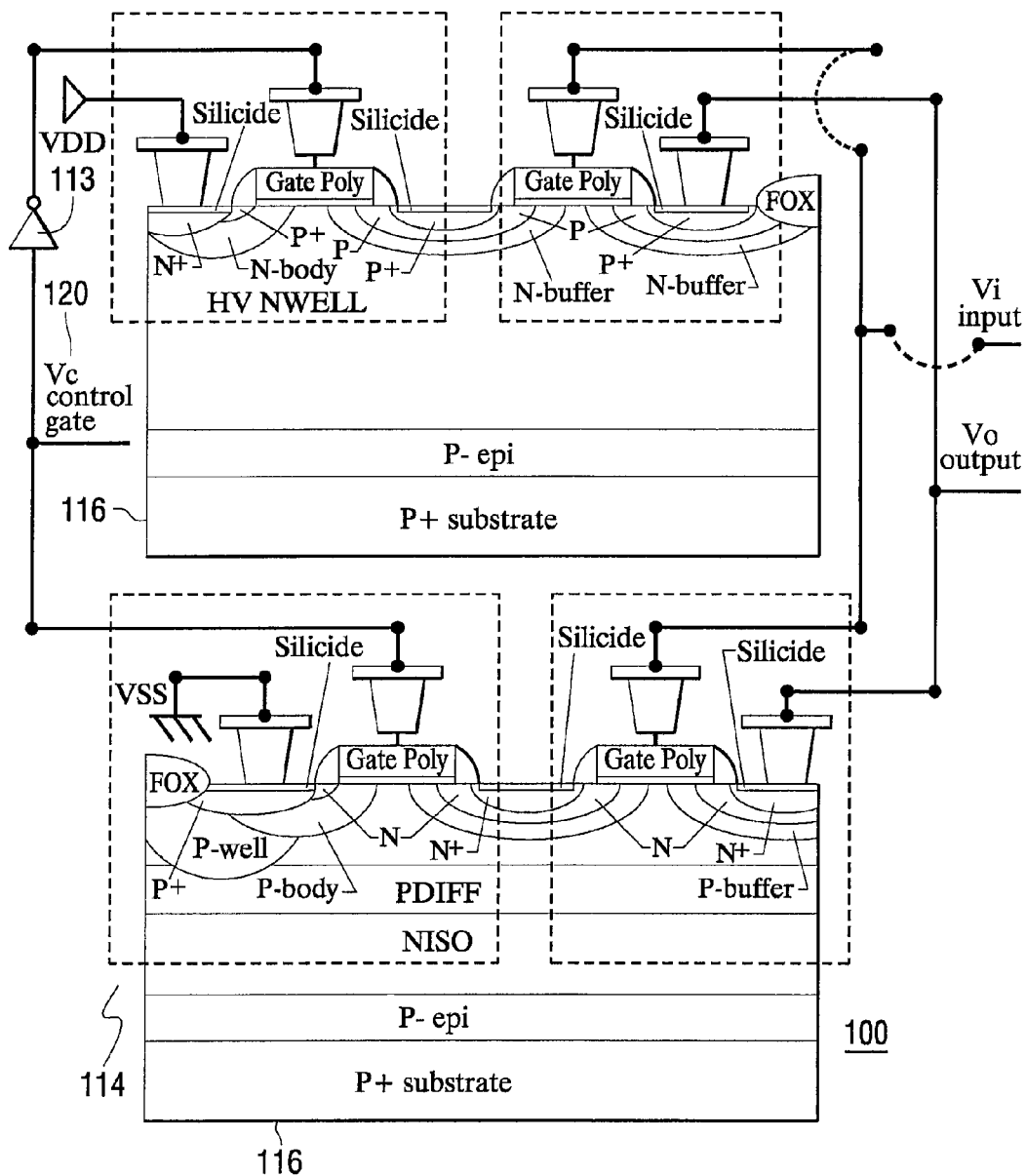
FIG. 1 is a schematic cross-section view a first exemplary embodiment.
Figure 2:
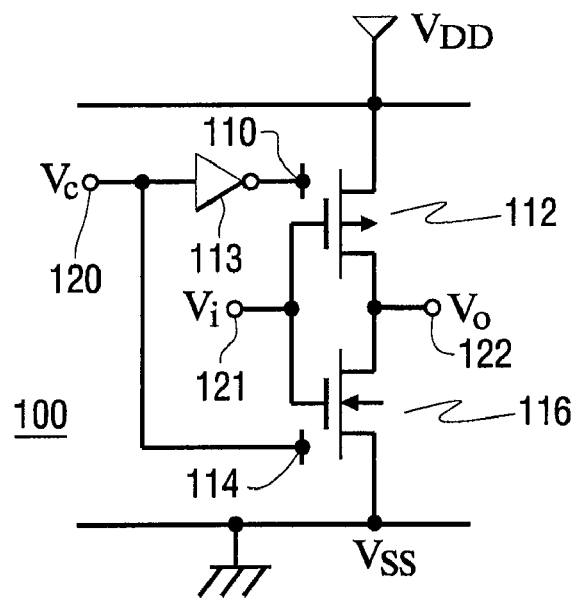
FIG. 2 is a circuit schematic view of FIG. 1.

One exemplary embodiment of the invention is illustrated in FIG. 1 and FIG. 2. They show an integrated high threshold voltage CMOS device 100 with an extra control gate 120. The PMOS transistors include a high threshold voltage (htv) transistor 110 and a low voltage threshold (ltv) transistor 112. The NMOS transistors include a high threshold voltage transistor 114 and a low threshold voltage transistor 116. The source of ltv transistor 112 is connected to the drain of htv transistor 110 and that the drain of ltv transistor 112 forms the output terminal 122 of the device. The source of ltv transistor 116 is connected to the drain of htv transistor 114 and the drain of ltv transistor 116 forms the output terminal 122 of the device.

The gates of the transistors 112 and 116 are connected together at the input terminal 121. A control gate 120 is connected via an inverter 113 to the gate of the htv PMOS transistor 110 and to the gate of the htv NMOS transistor 114.

In operation, when the gate control 120 is high enough to turn on the two high threshold transistors 110, 114, then the low threshold transistors 112, 116 operate at high speeds. However, when the gate control signal is low and turns off the high threshold transistors, the circuit enters a standby state. In that state, its leakage currents are greatly reduced by the high threshold transistors 110, 114. Each high voltage threshold transistor is in series with its corresponding low threshold transistor. When the gate control signal is high, the low threshold transistor switches rapidly, but when the control gate signal is low, the circuit 100 enters a standby mode and leakage currents are reduced.

Figure 4:
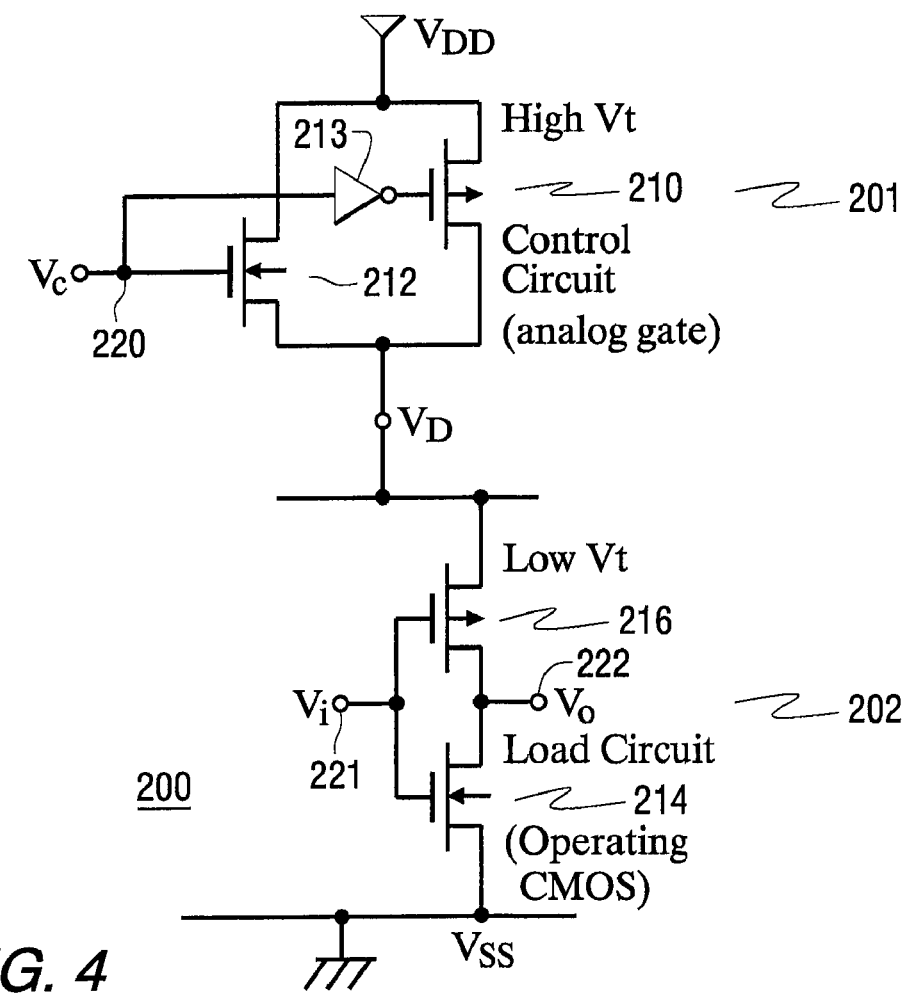
FIG. 4 is a circuit schematic view of FIG. 3.
Figure 3:
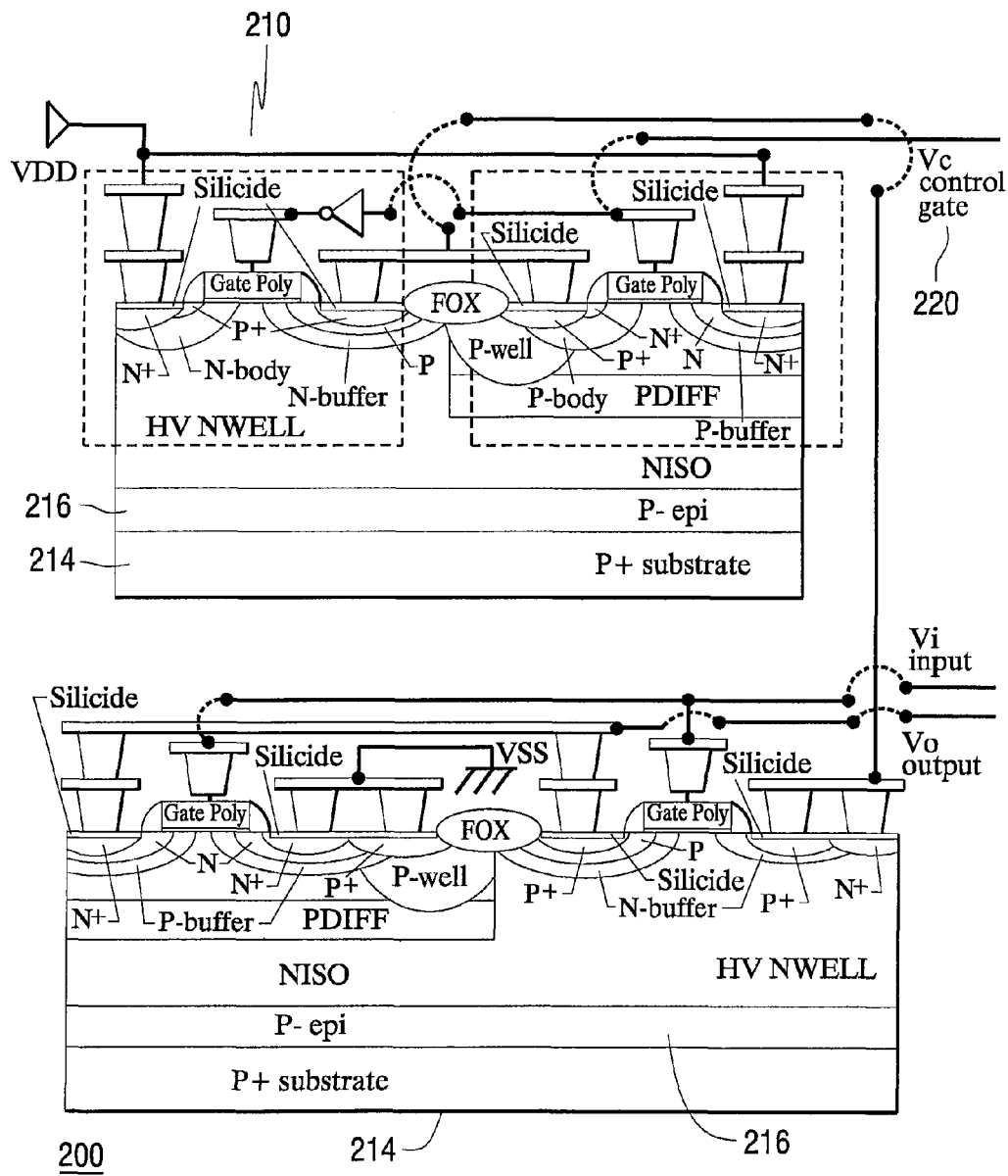
FIG. 3 is a schematic cross-section view a second exemplary embodiment.

Another exemplary embodiment is illustrated in FIG. 3 and FIG. 4. They show an integrated circuit 200 with a high threshold voltage analog gate 201 connected to low threshold voltage switching CMOS pair of transistor 202. A voltage supply or current source line Vdd is connected to the source/drains of the high threshold voltage transistors 210, 212. The source of htv 212 and the drain of htv 210 are connected together to provide an output terminal to the series connection of the low threshold voltage transistors 216, 214. The high threshold voltage PMOS transistor 210 and the high threshold voltage NMOS transistor 212 are connected together in an analog gate configuration. A gate control voltage is applied to the control terminal 220. That terminal is connected to the gate of the NMOS high threshold voltage transistor 212. Terminal 220 is also connected to an inverter 213 which is connected to the gate of the PMOS high threshold voltage transistor 210. The analog gate 201 is connected to the source of the low threshold voltage PMOS transistor 216. The drain of transistor 216 is connected to the drain of NMOS low threshold voltage transistor 214. The two low threshold voltage transistors are connected in series with each other, one end of the series connection is connected to the source/drains of the high threshold voltage transistors and the other end is connected to a reference voltage, Vss, or ground. The gates of the two low threshold voltage CMOS transistors 214, 216 are connected to the input voltage terminal 221 and the output terminal is at the connection of their drain.

In operation, when the input to the analog gate terminal 220 has a high enough voltage, the high threshold transistors 210, 212 turn on and allow the low voltage CMOS transistors 214, 216 to operate at high speed. When the voltage on the analog control terminal 220 is low, the circuit 200 enters stand by mode and leakage currents are greatly reduced. In other words, the analog gate 201 controls the connection of the low threshold voltage CMOS transistors to the voltage source VDD.

Figure 5:
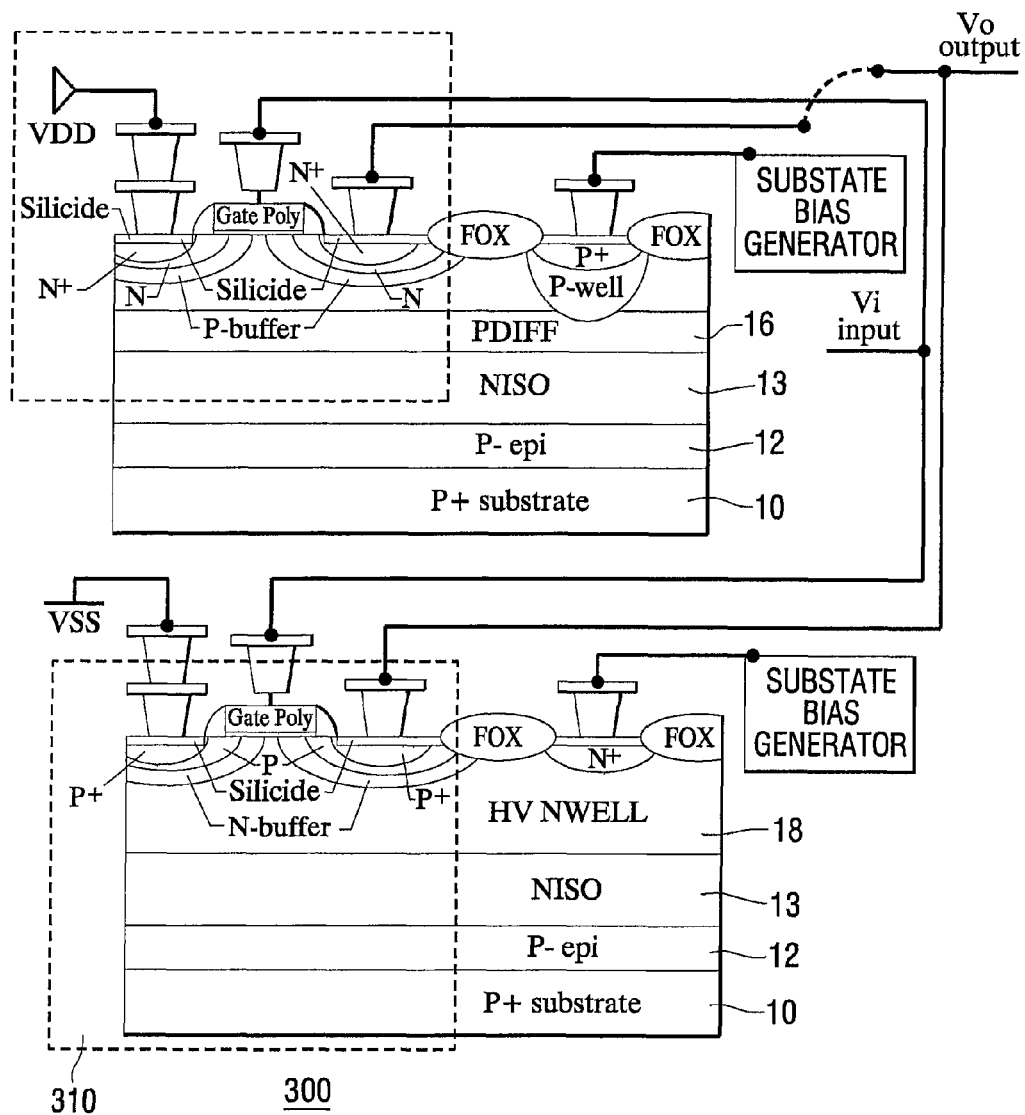
FIG. 5 is a schematic cross-section view a third exemplary embodiment.
Figure 6:
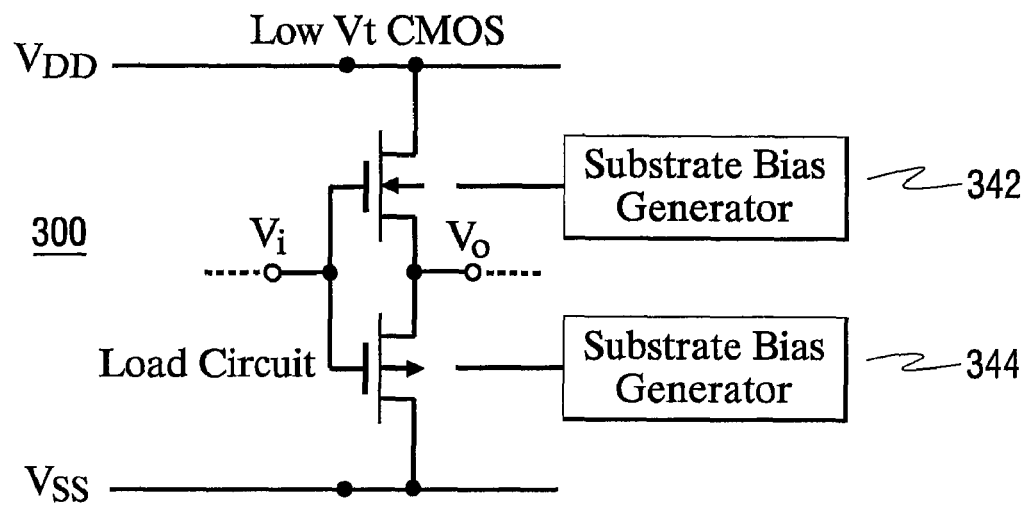
FIG. 6 is a circuit schematic view of FIG. 5.
Figure 7:
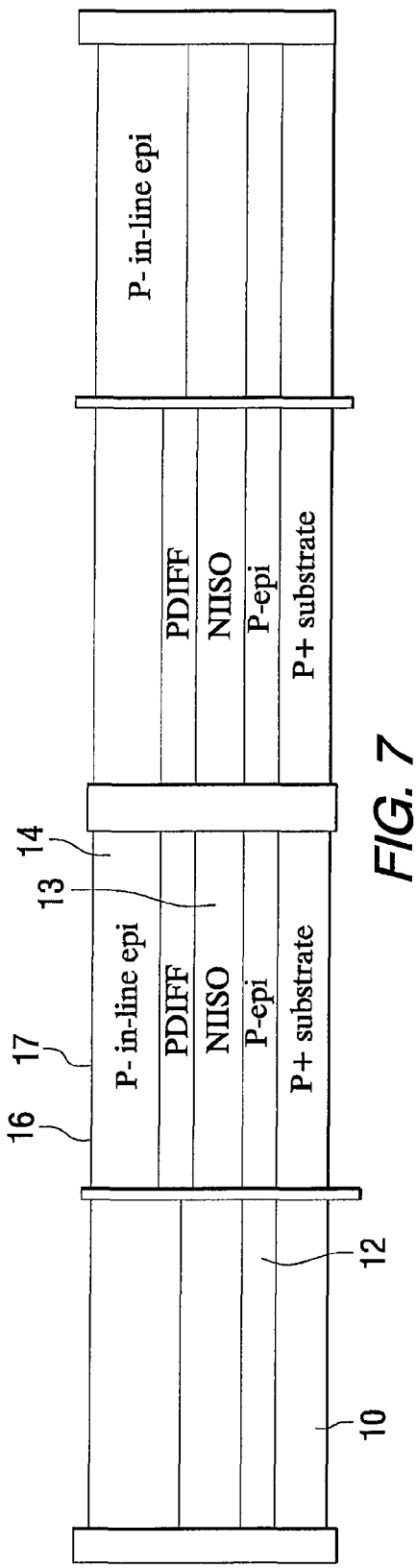
FIG. 7-12 show steps in the process of forming one or more of the exemplary embodiments

A third exemplary embodiment is circuit 300 shown in FIG. 5 and FIG. 6. The circuit has CMOS threshold low voltage transistors 314, 310 as a load circuit for a substrate bias generator. One bias generator is connected to the isolated p-diff layer 16 which is formed on the top of the isolated NISO layer and the other bias generator is connected to the high voltage n-well 18. In operating mode, the bias voltages are not supplied and the CMOS unit operates with high speed. In stand-by mode, bias voltages are supplied and the CMOS unit leakage current is greatly reduced. A suitable switch (not shown) is operable to turn the bias generators on or off or to connect or disconnect the bias generators 342, 344 to the low threshold voltage transistors 314, 310 depending upon whether the circuit is in high speed mode or standby mode.

Turning to FIGS. 7-12, there are shown key steps in the process for forming the novel high and low threshold CMOS devices. Beginning with FIG. 7, the process uses a p+ substrate 10 (or p-substrate not shown) The p+ substrate 10 is placed in an epitaxial reactor where a first p-type epitaxial layer 12 is grown on the substrate. The layer 12 has a concentration of about 1e15 cm$^{-3}$ in a preferred range of 1e14 to 7e15 cm$^{-3}$. The epitaxial layer 12 is then implanted with n-type ions and driven to form an n-type isolation layer 13. Implanting is done with an ion beam to form n-isolation region with a doping concentration of about 1e16 to 1e19 cm$^{-3}$. P-type ions (boron) are implanted to form a p-diff layer 16. Implanting is done with an ion bean to achieve a doping consentration of about 1e16 to 1e19 cm$^{-3}$. A second p-type in-line epitaxial layer 14 is grown on the substrate. The layer 14 has a concentration of about 1e15 cm$^{-3}$ in a preferred range of 1e14 to 7e15 cm$^{-3}$. The in-line epitaxial layer 14 is used as base layer which could be isolated to starting substrate 10 to build future isolated high speed, low power consumption CMOS units in the invention.

Figure 8:
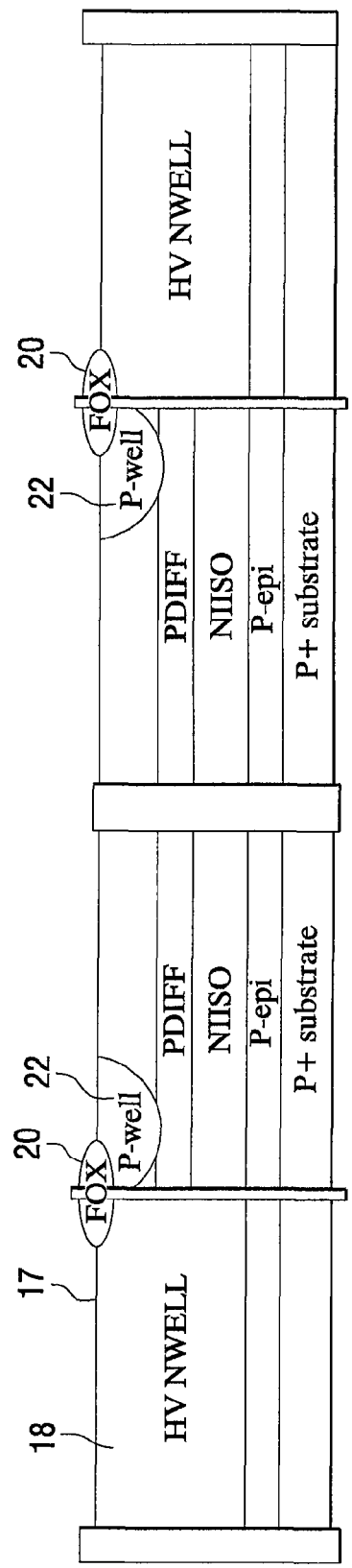

Turning to FIG. 8, it shows formation of the field oxide regions 20, p-wells 22 and high voltage n-well regions 18. The field oxide regions separate the PMOS transistors from the NMOS transistors. Field oxide regions are made by thermally oxidizing the portions of the surface 17 to form thick oxide regions on the surface 17. In a first step, a thin buffer oxide layer (not shown) is thermally grown on the surface 17. Next, a layer of silicon nitride (not shown) is deposited and selected portions of the nitride is removed from above the future field oxide regions to expose portions of the surface 17 with thin buffer oxide. The exposed portions are thermally oxidized to grow a thick field oxides. After completion, the residual nitride layer is removed.

Next, the surface 17 is patterned to form p-wells 22. The surface 17 is masked with photoresist that is applied in a layer of uniform thickness. Photoresist masking and etching are process steps well known to those of ordinary skill in the art and are not shown in detail. Openings in the mask define future p-wells that are adjacent the field oxide regions 20 and over the p-diff layer 16. The patterned substrate is placed in an ion implanted and implanted with boron form p-wells 22. Implanting is done with an ion beam to achieve a doping concentration of about 3e16 to 8e17 cm$^{-3}$.

Next, the surface 17 is patterned to form the high voltage n-wells 18. The surface 17 is masked with photoresist and the openings in the mask define future high voltage n-well regions. The patterned substrate is placed in an ion implanter and implanted with phosphorous to form high voltage n-wells 18. The exposed future n-well regions 18 are implanted with n-type dopants, such as phosphorous. Implanting is done with an ion beam to achieve a doping concentration of about 3e15 to 3e17 cm$^{-3}$.

Figure 9:
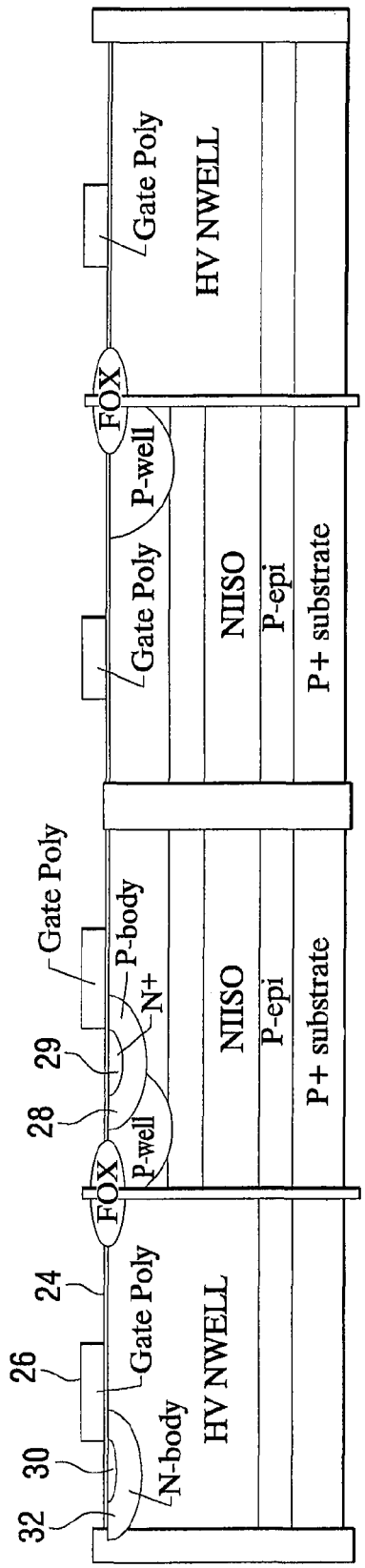

Turning to FIG. 9, it shows forming the gate oxides, gate electrodes, n+/p-body implants for n-channel mos devices and p+/n-body implants for p-channel devices. The surface 17 is thermally oxidized to grow a thin layer of gate oxide 24. Then a layer of doped polysilicon 26 is deposited on the gate oxide layer. The polysilicon layer is masked with photoresist or another suitable masking material to protect regions of future gate electrodes. The unmasked polysilicon is removed by etching. The residual polysilicon gate electrode 26 provides for the n-channel and p-channel transistors in the invention.

The n+/p-body and p+/n-body implants in source regions control the high threshold voltages. One dual-implant is used to form the htv NMOS source and another dual implant forms the htv PMOS source. These implants are self-aligned to the gate of the high threshold voltage CMOS transistors. As such, the two layers are stacked together with opposite polarity and self-aligned to the gate polysilicon formed in source regions of the high threshold voltage transistors. Photoresist is applied to the substrate and patterned to expose regions for making n+/p-body implants the p+/n-body implants. First and second mask are used. The first mask is used to form the n+ source 29 and p-body implant 28. As such, the n+ source (first polarity) is formed through the same opening as the p-body (second polarity). Both types of implants are made trough the same opening in the mask. That mask is stripped and a second mask of photoresist mask is used to form the p+ source 30 (second polarity) and n-body 32 (first polarity) implant. Again, a single photoresist mask is used for both implants.

Figure 10:
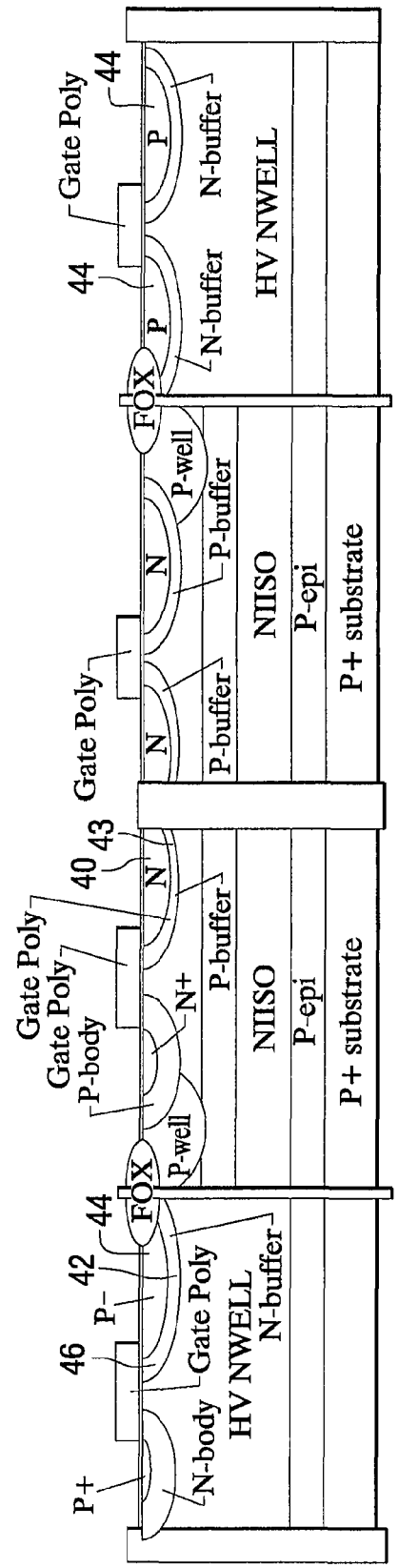

Turning now to FIG. 10, it shows forming n/p-type buffer layers 42/44 and p/n-type buffer layers 43/40. One dual implant is used to form the ltv NMOS source/drain and another dual implant forms the ltv PMOS source/drain. These dual implants are made with third and fourth masks. In each masking and implanting step the implants are self-aligned to the gates of the implanted transistors. The dual implants also form the drains of the htv transistors, respectively. These layers control the low threshold voltages for the respective low threshold voltage in n-channel and p-channel low threshold devices. The surface 17 and the gates are masked. For the n-channel devices, the surface source/drain regions of ltv and the surface drains of htv are exposed. In the same openings, the surface 17 is implanted with p-type buffer dopants 43, such as boron, followed by n-type implanting with phosphorous or arsenic 40. Implanting is done with an ion beam to achieve a doping concentration of about 7e16 and 3e17 cm$^{-3}$, respectively. That mask is stripped and new mask covers the n-channel devices and exposes the source and drain regions of the low threshold p-channel devices and the drain region of high threshold p-channel devices. An n-type dopant such as phosphorous or arsenic is implanted to form the n-buffers 42 and the same opening is implanted with p-type boron dopants 44 to form n/p-buffers 42/44 of the low/high threshold voltage p-channel transistors. Implanting is done with an ion beam to achieve a doping concentration of about 3e16 and 2e17 cm$^{-3}$, respectively.

Figure 11:
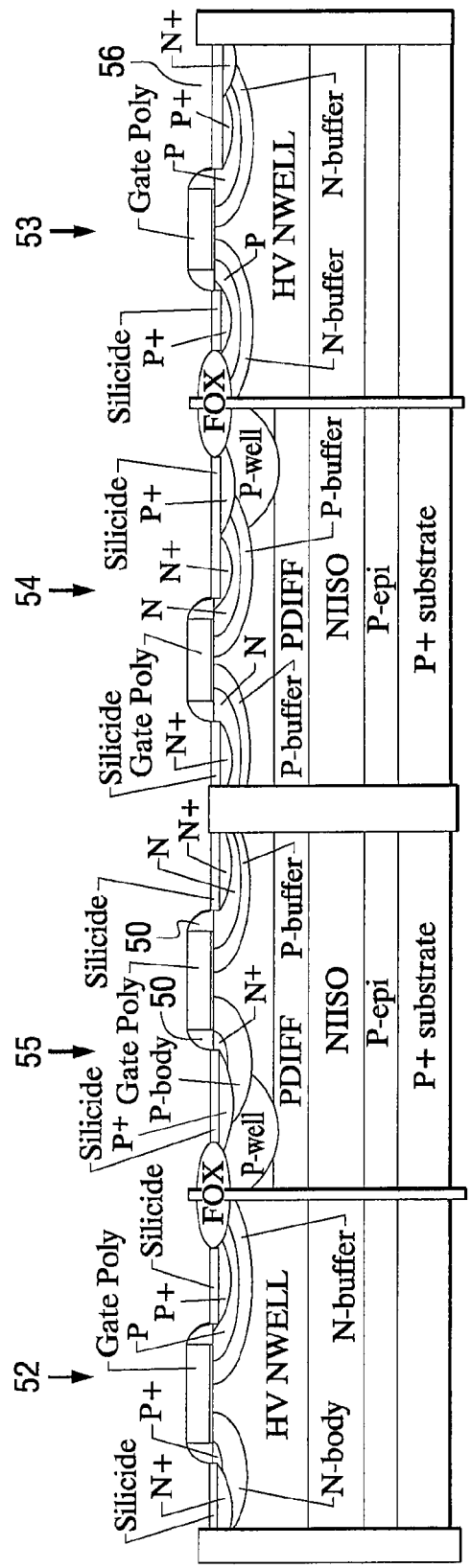

FIG. 11 shows the formation of sidewall oxide spacers 50 and contact implants. The contact implants are self-aligned to the gate sidewall oxide spacers. A layer of oxide 50 is deposited on the surface 17. A suitable etch step removes oxide from regions over the sources and drains and leaves oxide spacers 50 on the sidewalls of the gates. Next, the surface 17 is masked with photoresist and patterned to open regions for n-type implants 54/55. The openings are implanted with n-type dopants form n+ contacts in the sources and drains for n-channel ltv transistors and in the drains for n-channel htv transistors. Implanting is done with an ion beam to achieve a doping concentration of about 1e19 to 5e20 cm$^{-3}$. Then the n+ contact mask is stripped and the surface 17 is masked and patterned to provide p+ contacts 52/53 in the sources/drains of the low threshold voltage n-channel devices and in the drains of the p-channel high threshold voltage device. Implanting is done with an ion beam to achieve a doping concentration of about 1e19 to 5e20 cm$^{-3}$.

A silicide process following n+/p+ contact implants is used to form silicide layer on the top of n+ contact, p+ contact and also gate electrode areas 56. Silicon may be alloyed with one or more of the group consisting of cobalt, platinum, molybdenum, tantalum, tungsten or titanium-tungsten or any other suitable refractory metal that forms a silicide without reacting with silicon dioxide. A metal layer is blanket sputtered on the entire surface 17 followed by silicide sintering. Silicide is formed only where the metal is in contact with silicon. A chemical etch rinses off the unreacted metal, especially the metal covering the field oxide and oxide spacers. The silicide alloy process increases the conductivity of the silicided areas.

Figure 12:
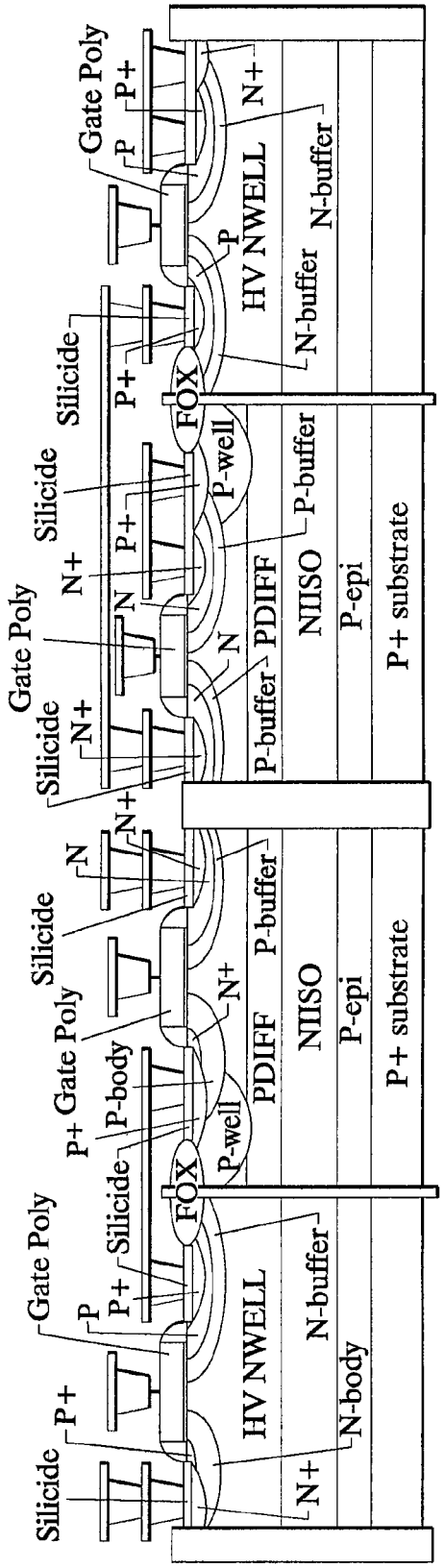

FIG. 12 shows the dual metal layers that form the device shown in FIG. 1 and FIG. 2. The metalization process begins with depositing an inter-level dielectric (ILD) material 62, such as deposited silicon dioxide, followed by planarizing the ILD layer. The planar ILD layer is then masked and openings in the mask are used to etch vias to the source, drain and body contact regions. After the vias are open, a first level of metal, such as aluminum, is deposited by sputtering (aluminum). Photoresist is applied to the metal layer and is patterned, to expose portions of the metal layer. The exposed metal is removed to establish a first level of metal contacts and interconnects 60. The process is repeated to form the second level of metal with its contacts and interconnections 64 disposed above a second ILD layer 64.

The exemplary process isolates the pairs of transistors from the substrate and from each other. The NMOS and the PMOS transistors are built in tubs that are junction isolated from the substrate. The PMOS devices are formed in N-well 18 which forms a p/n junction with the P-epitaxial layer 12. Likewise, the NMOS devices are formed above an N-isolation layer 13. The NMOS and PMOS devices are laterally isolated from each other by field oxide regions 20.

The devices and processes described above in the exemplary embodiments provide circuits with high speed and low power consumption. This is a particular characteristic of the LTV CMOS devices. The HTV/LTV CMOS pairs are isolated from the rest of the substrate and thus provide an advanced analog CMOS building block for future circuits. This new building block can meet high voltage ratings, switch rapidly, has very low leakage and consumes very low power.

The HTV CMOS operates in a stand-by mode for low power consumption, but once turned on, allows the LTV CMOS to operate at high speed. Since all the transistors are built in isolation tubs, they are also isolated from substrate noise.

Computer simulation data compared the performance of the HTV and LTV transistors to comparable DMOS and standard CMOS transistors. For equivalent size transistors, the LTV CMOS had a threshold voltage of around 0.04 volts compared to standard CMOS threshold voltages of 0.8 volts. As such, the threshold voltage is reduced by a factor of 20 times. The on resistance of the circuits 100, 200 are 60% or less compared to the on resistance of conventional combinations. The exemplary embodiments can operate at frequencies as high as 27 GHz, compared to 14 GHz of typical prior art devices. Standard CMOS devices have large leakage currents if with very low threshold voltages. However, due to the HTV CMOS devices that control the LTV CMOS transistors, the leakage of circuits 100, 200 is virtually zero.

The exemplary circuits and processes include pairs of CMOS devices with vastly different thresholds. The different thresholds are achieved by making double implants with opposite polarity self-aligned to gate poly polysilicon into the same mask openings for sources and drains of the CMOS devices. This method contrasts with conventional threshold adjustments that implant the channels of the devices to alter their thresholds. These dual implant steps allow the exemplary devices to be built with a simple process flow for low cost.

The invention claimed is:

1. A semiconductor device comprising:
a low threshold PMOS device formed over an N-type region, the source and drain of the low threshold PMOS formed in P-regions surrounded by N-regions;
a low threshold NMOS device formed in a P-type region, the source and drain of the low threshold NMOS formed in N-regions surrounded by P-regions;
first and second substrate bias generators, each connected to one of the low threshold devices for generating a substrate bias;
a voltage source for generating substrate bias during a standby mode to reduce leakage current;
wherein a low voltage threshold is established by the source and drain regions of the low threshold devices and their respective surrounding regions of opposite polarity.

2. A semiconductor device of claim 1 wherein the gates of both devices are connected to an input terminal.

3. A semiconductor device of claim 2 wherein a drain of one device is connected to a source of the other device and the connection is coupled to an outlet terminal.

4. A semiconductor device comprising:
a low threshold PMOS device formed over an N-type region, the source and drain of the low threshold PMOS formed in P-regions surrounded by N-regions;
a low threshold NMOS device formed in a P-type region, the source and drain of the low threshold NMOS formed in N-regions surrounded by P-regions;
first and second substrate bias generators, each connected to one of the low threshold devices for generating during a standby mode a low threshold voltage by the source and drain regions of the low threshold devices and their respective surrounding regions of opposite polarity.

5. A semiconductor device of claim 4 wherein the gates of both devices are connected to an input terminal.

6. A semiconductor device of claim 5 wherein a drain of one device is connected to a source of the other device and the connection is coupled to an outlet terminal.

7. A semiconductor device of claim 4, wherein the low threshold devices provide a load circuit for the substrate bias generators.

8. A semiconductor device of claim 4, wherein one bias generator is connected to an isolated p-diff layer formed on top of an isolated NISO layer and the other bias generator is connected to a high voltage n-well.

9. A semiconductor device of claim 4, wherein in stand-by mode, the bias generator voltages are supplied and in operating mode, the bias generator voltages are not supplied.

10. A semiconductor device of claim 4, wherein a switch is utilized to turn the bias generators on or off.

11. A semiconductor device of claim 4, wherein a switch is utilized to connect or disconnect the bias generators.

12. A semiconductor device of claim 4, wherein each low threshold device source and drain are self aligned to a gate.

* * * * *